United States Patent
Potanin et al.

(10) Patent No.: US 6,919,811 B1
(45) Date of Patent: Jul. 19, 2005

(54) CHARGER DETECTION AND ENABLE CIRCUIT

(75) Inventors: Vladislav Potanin, San Jose, CA (US); Elena Potanina, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 192 days.

(21) Appl. No.: 10/448,603

(22) Filed: May 30, 2003

(51) Int. Cl.[7] .............................................. G08B 21/00
(52) U.S. Cl. ........................ 340/657; 340/660; 323/304; 323/311
(58) Field of Search ................................ 340/657, 660, 340/661, 664; 323/304, 311, 312, 313, 314

(56) References Cited

U.S. PATENT DOCUMENTS

| | | | | |
|---|---|---|---|---|
| 4,377,781 A | * | 3/1983 | Tatsushi et al. | 323/299 |
| 5,175,489 A | * | 12/1992 | Mizuide | 323/315 |
| 5,610,506 A | * | 3/1997 | McIntyre | 323/313 |
| 6,392,392 B1 | * | 5/2002 | Nakahara | 323/312 |
| 6,420,936 B1 | * | 7/2002 | Nishiyama | 330/297 |
| 6,456,086 B1 | | 9/2002 | Bolz et al. | |
| 6,703,813 B1 | * | 3/2004 | Vladislav et al. | 323/270 |
| 6,717,458 B1 | * | 4/2004 | Potanin | 327/536 |

* cited by examiner

Primary Examiner—John Tweel, Jr.
(74) Attorney, Agent, or Firm—Brett A. Hertzberg; Merchant & Gould PC

(57) ABSTRACT

A detection circuit is configured to detect the presence of a power source by comparing two input voltages (VIN1, VIN2). An example detection circuit is arranged, such that the first input voltage (VIN1) may operate above the process limit for transistor breakdown, while the second input voltage (VIN2) should be maintained below the transistor breakdown voltage. The detection circuit includes a built-in offset voltage (VOS) for hysteresis such that the detection signal is activated when VIN1>VIN2+VOS. The detection circuit is useful for providing an enable signal in a battery charger application. It is envisioned that the detection circuit is also useful in other applications where detection of a power source is required, and where detection of one voltage relative to another may be desired.

16 Claims, 3 Drawing Sheets

CHARGER DETECTION AND ENABLE CIRCUIT

FIELD OF THE INVENTION

The present invention is related to battery charger technology. More particularly, the present invention is related to a circuit that detects a voltage level from a source such as a battery charger. An example detection circuit according to the present invention employs a comparator that is configured with offset and hysteresis.

BACKGROUND OF THE INVENTION

Demand for portable electronic devices is increasing each year. Example portable electronic devices include: laptop computers, personal data assistants (PDAs), cellular telephones, and electronic pagers. Portable electronic devices place high importance on total weight, size, and battery life for the devices.

Most portable electronic devices employ rechargeable batteries. Commonly used rechargeable batteries include Nickel-Cadmium (NiCad), Nick-Metal-Hydride (NiMHi), Lithium-Ion (Li-Ion), and Lithium-Polymer based technologies. Charger circuits are commonly available for each of these types of battery technologies. Each charger circuit includes a shunt regulator to control the amount of charge that is delivered to the battery.

An example shunt regulator charging system is shown in FIG. 3. As shown in FIG. 3, the shunt regulator charging system includes a power source (PS), a shunt regulator (302), and a rechargeable battery (BATT). The power source (PS) includes a voltage source (VS) and a source resistance (RS). The shunt regulator (302) includes a-NMOS transistor (MN), a PMOS transistor (MP), an amplifier (AMP), and three resistors (R31-R33).

In operation the power source provides a charging current (I) to the lithium battery through source resistance RS, PMOS transistor circuit MP, and resistor R33. Resistor R33 converts the charging current (I) into a voltage (VSNS), which is used by other circuitry (not shown) to control the activation of transistor MP. PMOS transistor MP is activated during normal charging operations. Resistors R3 and R32 form a voltage divider that provide a feedback signal to amplifier AMP. Amplifier AMP compares the feedback signal to a reference voltage (VREF) and provides a control signal to transistor MN. Transistor MN, amplifier AMP, and resistors R31–R32 together operate as a shunt regulator that regulates the input voltage (VIN). The shunt regulator provides safe charging of lithium battery BATT by limiting the charging voltage (input voltage) similar to a zener diode.

In many applications, the shunt regulator is implemented as either part of the battery pack, or as part of the circuit in the portable electronic device. In an effort to minimize power consumption, the shunt regulator circuit (e.g., 302) should be disabled when the charging power source (e.g., PS) is disconnected from the system. Various circuits have been developed to detect the presence of the power source so that the shunt regulator is disabled (as well as other circuits) when no charging power source is present in the system.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1:
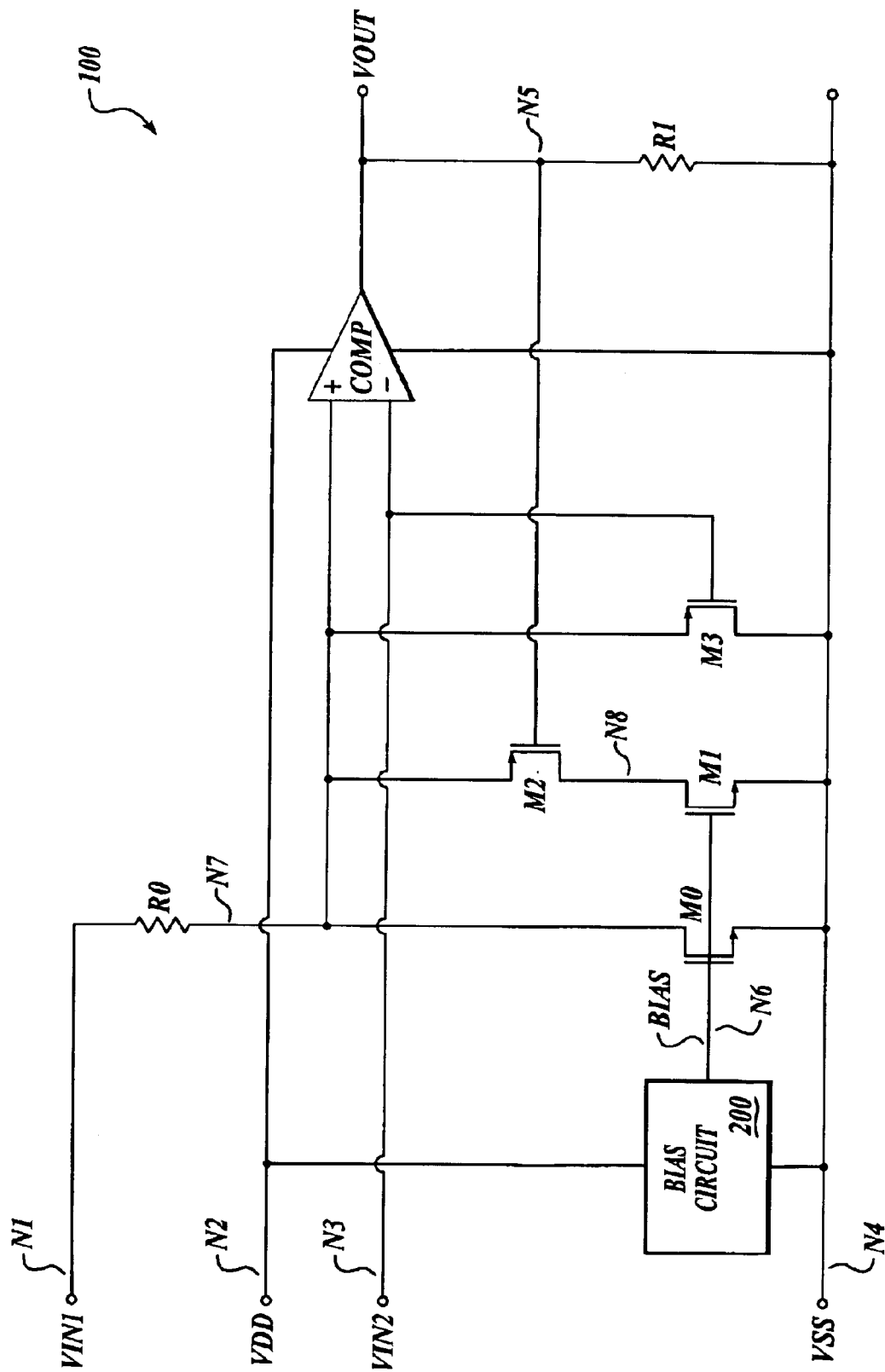
FIG. 1 is an illustration of a schematic diagram for a detection and enable circuit that is arranged according to an embodiment of the present invention.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meaning of "a," "an," and "the" includes plural reference. The meaning of "in" includes "in" and "on." The term "connected" means a direct connection between the items connected, without any intermediate devices. The term "coupled" refers to both direct connections between the items connected, and indirect connections through one or more intermediary items. The term "circuit" may refer to both single components, and to a multiplicity of components. The term component refers to one or more items that are configured to provide a desired function. The term "signal" includes signals such as currents, voltages, charges, logic signals, data signals, optical signals, electromagnetic waves, as well as others. Referring to the drawings, like numbers indicate like parts throughout the views.

Briefly stated, the present invention is related a detection circuit that is configured to detect the presence of a power source by comparing two input voltages (VIN1, VIN2). An example detection circuit is arranged such that the first input voltage (VIN1) may operate above the process limit for transistor breakdown, while the second input voltage (VIN2) should be maintained below the transistor breakdown voltage. The detection circuit includes a built-in offset voltage (VOS) for hysteresis such that the detection-signal is activated when VIN1>VIN2+VOS. The detection circuit is useful for providing an enable signal in a battery charger application. It is envisioned that the detection circuit is also useful in other applications where detection of a power source is required, and where detection of one voltage relative to another may be desired.

FIG. 1 is an illustration of a schematic diagram (100) for a detection circuit that is arranged according to an embodiment of the present invention. Detection circuit 100 includes resistance circuits R0–R1, transistor circuits M0-M3, comparator circuit COMP, and bias circuit 200.

Resistance circuit R0 is coupled between node N1 and N7. Resistance circuit R1 is coupled between node N5 and N4. Transistor circuit M0 includes a drain that is coupled to node. N7, a gate that is coupled to node N6, and a source that is coupled to node N4. Transistor circuit M1 includes a drain that is coupled to node N8, a gate that is coupled to node N6, and a source that is coupled to node N4. Transistor circuit M2 includes a drain'that is coupled to node N8, a-gate that is-coupled to node N5, and a source that is coupled to node N2. Transistor circuit M3 includes a drain that is coupled to node N4, a gate that is coupled to node N3, and a source that is coupled to node N7. Comparator circuit COMP includes a non-inverting input that is coupled to node N7, an inverting input that is coupled to node N3, an output th at is coupled to node N5, a first power port that is coupled to node N2, and a second power port that is coupled to node N4. Bias circuit 200 includes a first power port that is coupled to node N2, a second power port that is coupled to node N4, and an output that is coupled to node N6.

A power signal is applied across nodes N2 and N4 as VDD and VSS, respectively. The power signal may be provided from a battery in a battery powered electronic device, regulated down from the battery voltage (e.g., via an LDO Regulator), or any other reasonable source as may be required. A voltage from a power source (e.g., from a battery charger) is provided to node N1 as signal VIN1. The voltage from a raw or unregulated voltage (e.g., from the battery) is coupled to node N3 as signal VIN2. VIN2 may be a divided down version of the raw voltage, as may be desired in certain applications. Bias circuit 200 is arranged to provide bias signal BIAS at node N6. Comparator circuit COMP is arranged to provide an output signal at node N5 as signal VOUT. Resistance circuit R1 is arranged to operate as a pull-down circuit for comparator circuit COMP and may be eliminated when comparator circuit COMP includes an internal pull down circuit.

Transistor circuit M0 is configured to operate as a first current source that sinks a first current (I0) from node N7. Transistor circuit M1 is configured to operate as a second current source that sinks a second current (I1) from node N8. Transistor circuits M0 and M1 are biased by the bias signal (BIAS). In one example, the first current (I1) and the second current (I2) are matched to one another. In another example, the first current (I1) and the second current (I2) are different from one another. Transistor circuit M2 is configured to selectively couple the second current source to node N7 when activated such that hysteresis is provided in the system. Transistor circuit M2 is responsivee to the output signal (VOUT) such that transistor circuit M2' is activated when VOUT≦VIN2−|VTH2|, and deactivated when VOUT>VIN2+|VTH2|, where VTH2 corresponds to the threshold voltage associated with transistor circuit M2.

Resistance circuit R0 is arranged to provide a voltage drop from node N1 to node N7 such that voltages associated with transistor breakdown are isolated from the non-inverting input of comparator circuit COMP. For example, comparator circuit COMP may include a differential pair input stage, where the gates of the transistors in the input stage correspond to the non-inverting and inverting inputs, respectively. The breakdown voltage of the input stage will correspond to the voltage limit for the input transistors (i.e., the differential pair). The gate voltages associated with the input transistors have process limits based on the maximum potential across the gate-oxide layers in those transistors (e.g., FETs). VIN1 will be limited to a maximum voltage that is associated with the breakdown voltage of resistance circuit R0. The voltage drop from resistance circuit R0 is given by VDROP=(I0*R0) or VDROP=(I0+I1)*R01, depending on output signal VOUT. Thus; the voltage at node N7 is given by: V7=VIN1−(I0*R0) or V7=VIN1−(I0+I1)*R0. VIN2 is limited to a maximum voltage that is associated with the sum of the breakdown voltage of a transistor (VBRK) and the threshold voltage (VTH) associated with a transistor (e.g., a p-type transistor).

Transistor circuit M3 is an optional circuit that is arranged to clamp the voltage (V7) associated with node N7 such that V7≦VIN2+|VTH3|, where VTH3 corresponds to the threshold voltage associated with transistor circuit M3. In one example, transistor circuit M3 may be included within comparator circuit COMP. In another example, transistor circuit M3 may be eliminated. When transistor circuit M3 coupled to node N7 as shown in FIG. 1, the voltage (V7) at node N7 is clamped.

Detection circuit 100 is arranged to provide an output signal (VOUT) at node N5. The output signal (VOUT) can be used to disable circuitry that will drain current from the battery in the system (e.g., VIN2). The operation of detection circuit 100 includes at least three operating modes depending on the voltages associated with VIN1 and VIN2.

In a first operating mode (e.g., no charger), the power source is decoupled from node N1. The voltage (V7) associated with node N7 may initially be greater than VIN2 such that transistor circuit M2 is deactivated by signal VOUT. For this example, the first current source that is provided by transistor circuit M0 is configured to "pull down" node N7 towards VSS. After the voltage associated with node N7 has dropped below VIN2, signal VOUT activates transistor circuit M2 such that transistor circuits M0 and M1 both "pull down" the voltage at node N7 to approximately VSS. The output of comparator circuit COMP will settle to approximately VSS after the potential at node N7 drops below VIN2 by a sufficient amount (e.g., minimum overdrive and offsets for COMP). The voltage associated with signal VOUT corresponds to a low logic level since the power source is detected as disconnected from the system.

In a second operating mode (e.g., discharged battery with charger applied), the power source is coupled to node N1 such that the voltage associated with node N1 corresponds to VIN1 and V7>VIN2. Since V7>VIN2, comparator circuit COMP drives output signal VOUT to a high logic level (e.g. VDD), indicating that the power-source is properly detected. Transistor circuit M2 is deactivated by signal VOUT such that the second current source is decoupled from node N7.

In a third operating mode (e.g., battery charged with charger applied), the power source is coupled to node N1 such that the voltage associated with node Ni corresponds to VIN1 and V7<VIN2. Since V7<VIN2, comparator circuit COMP allows output signal VOUT to drop to a low logic level (e.g., VSS), indicating that the power source is not detected. This example applies to a condition where an improper power source with a low voltage is applied to node N1, or when the battery is fully charged. The output signal can be used to disable circuitry that will drain current from the battery in the system (e.g., VIN2).

Figure 2:
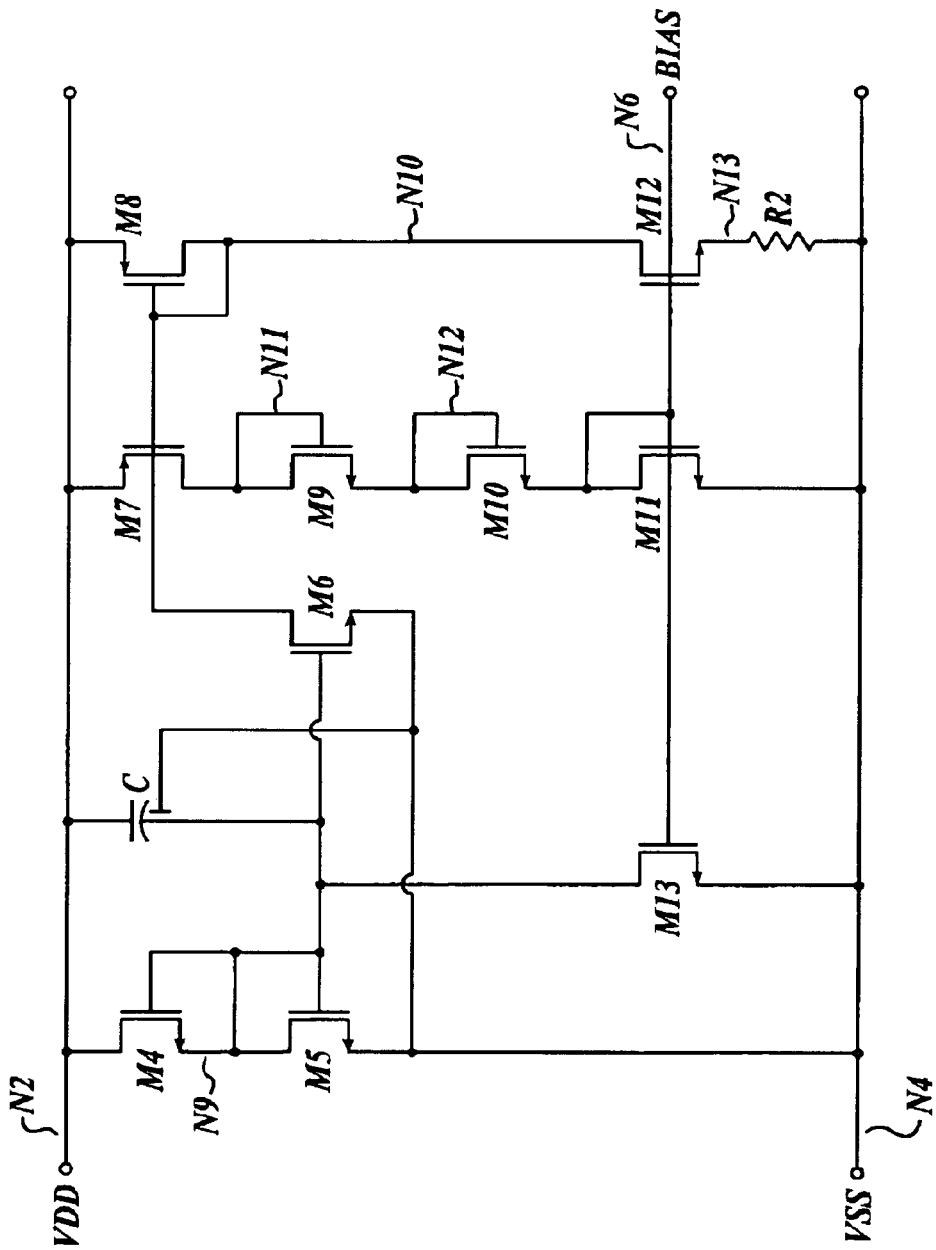
FIG. 2 is an illustration of a schematic diagram for a bias circuit that is arranged to bias the detection and enable circuit that is illustrated in FIG. 1.
Figure 3:
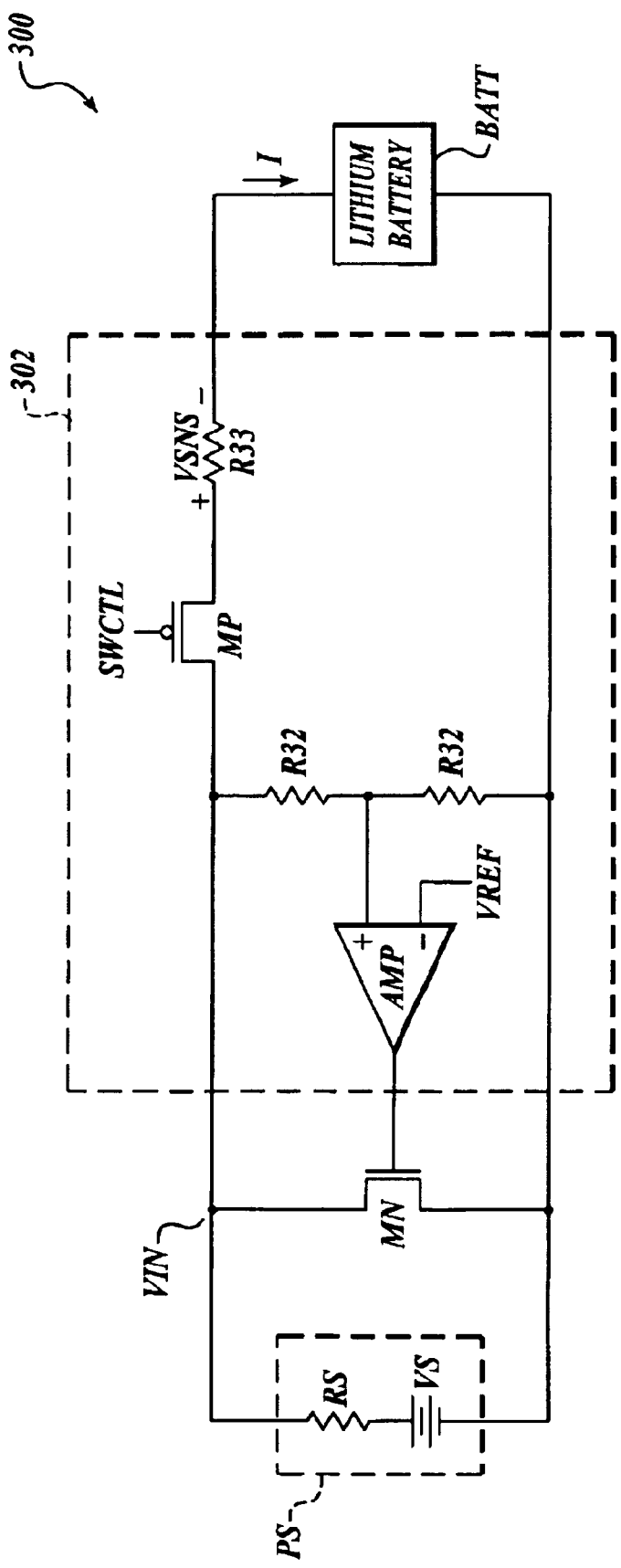
FIG. 3 is an illustrations of a schematic diagram for a conventional shunt regulator.

FIG. 2 is an illustration of a schematic diagram for a bias circuit (200) that is arranged to bias the detection and enable circuit that is illustrated in FIG. 1. Bias circuit 200 includes transistor circuits M4-M13, resistance circuit R2, and capacitor circuit C.

Transistor circuit M4 includes a drain that is coupled to node N2, a gate that is coupled to node N9, and a source that is coupled to node N9. Transistor circuit M5 includes a drain that is coupled to node N9, a gate that is coupled to node N9, and a source that is coupled to node N4. Transistor circuit M6 includes a drain that is coupled to node N10, a gate that is coupled to node N9, and a source that is coupled to node N4. Transistor circuit M7 includes a drain that is coupled to node N11, a gate that is coupled to node N10, and a source that is coupled to node N2. Transistor circuit M8 includes a drain that is coupled to node N10, a gate that is coupled to node N10, and a source that is coupled to node N2. Transistor circuit M9 includes a drain that is coupled to node.

N11, a gate that is coupled to node N11, and a source that is coupled to node N12. Transistor circuit MIO includes a drain that is coupled to node N12, a gate that is coupled to node N12, and a source that is coupled to node N6. Transistor circuit M11 includes a drain that is coupled to node N6, a gate that is coupled to node N6, and a source that is coupled to node N4. Transistor circuit M12 includes a drain that is coupled to node N10, a gate that is coupled to node N6, and a source that is coupled to node N13. Transistor circuit M13 includes a drain that is coupled to node N9, a gate that is coupled to node N6, and a source that is coupled to node N4. Resistance circuit R2 is coupled between node N13 and node N4. Capacitor circuit C includes a top plate that is coupled to node N2, a bottom plate that is coupled to node N9, and a parasitic plate that is coupled to node N4.

In operation, power signals are applied across nodes N2 and N4, as signals VDD and VSS, respectively. Transistor circuits M7-M12 and resistor R2 are arranged to operate as a biasing circuit that provides a bias signal (BIAS) at node N6. Transistor circuits M4-M6, M13 and capacitor circuit C are arranged to operate as a start-up circuit that initiates the biasing circuit into proper operation after power is applied to the system.

Transistors circuit M4-M5 and capacitance circuit C are arranged to detect the application of power to nodes N2 and N4. Capacitance circuit C is arranged to couple current to node N9 when the power is increased at a rapid rate, while transistor circuit M4 is arranged to couple current (e.g., leakage current from transistor circuit M4) to node N9 when the power is increased very slowly such that the capacitance circuit is ineffective. Increased current at node N9 will activate transistor circuit M5 when sufficient voltage is available on the power supply lines (N2, N4). Transistor circuit M5 is arranged in a current mirror configuration with transistor circuit M6 such that transistor circuit M6 will "pull down" on node NIO. After sufficient power levels have developed in the system, transistor circuits M7-M12 will begin to operate such that transistor M13 will be activated. Activation of transistor circuit M13 will "pull down" on node N9 such that the startup circuit is disabled. Once steady-state operation is achieved, transistor circuits M4-M6, M13, and capacitance circuit C consume no appreciable current.

The startup circuit that is described above is merely one possible embodiment. Other startup circuits can be coupled to any one of nodes N10, N11, N12, and N6 such that the biasing circuit will begin operation.

Transistor circuits M9 and M10 are configured as diodes to prevent the biasing circuit from starting at very low voltages. In some example applications, transistor circuits M9 and M10 may be eliminated.

Transistor circuits M7 and M8 are arranged in a first current mirror configuration. Transistor circuits M11 and M12 are arranged in a second current mirror configuration, where the source of transistor circuit M12 is degenerated by resistance circuit R2. Thus, the voltage across resistance circuit R2 and the gate-source voltage associated with transistor circuit M12 are compared to the gate-source voltage associated with transistor circuit M11. The operating current for the transistor circuits M11 and M12 are adjusted by changing the value associated with resistance circuit R2 and the relative size of the transistors in the current mirrors (e.g., transistor circuits M11 and M12, and/or transistor circuits M7 and M8). The hysteresis associated with circuit 100 is adjusted by the changing the ratio (R2/R1) of values associated with resistance circuits R2 and R1, and also changing the relative sizes between transistor circuits M0 and M11, and M1 and M11.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus that is arranged to provide a detection signal, the apparatus comprising:

a resistance circuit that is coupled between a first node and a seventh node;

a first current source circuit that is coupled between the seventh node and a fourth node;

a second current source circuit that is selectively coupled between the seventh node and the fourth node in response to the detection signal; and a comparator circuit that includes a first input that is coupled to the seventh node, a second input that is coupled to a third node, and an output that is coupled to a fifth node, wherein the apparatus is arranged to operate when a power source is coupled to the first node.

2. The apparatus of claim 1, wherein the second current source is coupled between the seventh node and the fourth node when the detection signal is de-asserted, and wherein the second current source is decoupled form the seventh node when the detection signal is asserted.

3. The apparatus of claim 1, the first current source circuit comprising: a first transistor circuit that includes a drain that is coupled to the seventh node, a gate that is coupled to a bias signal, and a source that is coupled to the fourth node.

4. The apparatus of claim 1, the second current source circuit comprising: a second transistor circuit, and a third transistor circuit, wherein the second transistor circuit includes a drain that is coupled to an eighth node, a gate that is coupled to a bias signal, and a source that is coupled to the fourth node, and wherein the third transistor circuit includes a drain that is coupled to the eight node, a gate that is coupled to the fifth node, and a source that is coupled to the seventh node.

5. The apparatus of claim 1, wherein the first current source circuit comprises a first transistor circuit, and wherein the second current source circuit comprises a second transistor circuit and a third transistor circuit, wherein the first transistor circuit includes: a drain that is coupled to the seventh node, a gate that is coupled to a bias signal, and a source that is coupled to the fourth node, wherein the second transistor circuit includes: a drain that is coupled to an eighth node, a gate that is coupled to a bias signal, and a source that is coupled to the fourth node, and wherein the third transistor circuit includes: a drain that is coupled to the eight node, a gate that is coupled to the fifth node, and a source that is coupled to the seventh node.

6. The apparatus of claim 1, wherein the first and second current sources are arranged to cooperate with the resistance circuit such that the selective activation of the second current source circuit provides hysteresis in the apparatus that is responsive to the detection signal.

7. The apparatus of claim 1, wherein the comparator circuit comprises an input transistor that is associated with the first input, and wherein the resistance circuit is arranged to isolate voltages associated with the first node from the first input of the comparator circuit to prevent breakdown of input transistor.

8. The apparatus of claim 1, further comprising: a fourth transistor circuit that includes a drain that is coupled to the fourth node, a gate that is coupled to the third node, and a source that is coupled to the seventh node, wherein the fourth transistor circuit is configured to limit a voltage associated with the seventh node.

9. The apparatus of claim 1, further comprising a bias circuit that is arranged to bias the first and second current sources.

10. The apparatus of claim 9, the bias circuit comprising:
a first current mirror that is coupled to the second node, and arranged to reflect currents from a tenth node and a sixth node;
a second current mirror circuit that is coupled to the fourth node, and arranged to reflect currents from the sixth and tenth nodes; and
a second resistance circuit that is coupled to fourth node, wherein the second current mirror circuit and the second resistance circuit cooperate with one another to provide a biasing signal to the sixth node, wherein the biasing signal is employed by the first and second current source circuits.

11. The apparatus of claim 9, the bias circuit comprising:
an eighth transistor circuit that includes a source that is coupled to the second node, a gate that is coupled to a tenth node, and a drain that is coupled to a sixth node;
an ninth transistor circuit that includes a source that is coupled to the second node, a gate that is coupled to the tenth node, and a drain that is coupled to the tenth node;
an twelfth transistor circuit that includes a source that is coupled to the fourth node, a gate that is coupled to the sixth node, and a drain that is coupled to the sixth node;
a thirteenth transistor circuit that includes a source that is coupled to a thirteenth node, a drain that is coupled to the tenth node, and a gate that is coupled to the sixth node; and
a second resistance circuit that is coupled between the thirteenth node and the fourth node, whereby a biasing signal is provided to the sixth node, wherein the biasing signal is employed by the first and second current source circuits.

12. The apparatus of claim 10, the bias circuit comprising:
an eighth transistor circuit that includes a source that is coupled to the second node, a gate that is coupled to a tenth node, and a drain that is coupled to an eleventh node;
an ninth transistor circuit that includes a source that is coupled to the second node, a gate that is coupled to the tenth node, and a drain that is coupled to the tenth node;
a tenth transistor circuit that includes a source that is coupled to a twelfth node, a gate that is coupled to the eleventh node, and a drain that is coupled to the eleventh node;
a eleventh transistor circuit that includes a source that is coupled to a sixth node, a gate that is coupled to the twelfth node, and a drain that is coupled to the twelfth node;
an twelfth transistor circuit that includes a source that is coupled to the fourth node, a gate that is coupled to the sixth node, and a drain that is coupled to the sixth node;
a thirteenth transistor circuit that includes a source that is coupled to a thirteenth node, a drain that is coupled to the tenth node, and a gate that is coupled to the sixth node; and a second resistance circuit that is coupled between the thirteenth node and the fourth node, whereby a biasing signal is provided to the sixth node, wherein the biasing signal is employed by the first and second current source circuits.

13. The apparatus of claim 11, the bias circuit further comprising a startup circuit that is coupled to at least one of the sixth node and the tenth node such that the startup circuit activates the bias circuit when power is applied across the second and fourth nodes.

14. The apparatus of claim 11, the bias circuit further comprising:
a fifth transistor circuit that includes a drain that is coupled to the second node, a gate that is coupled to a ninth node, and a source that is coupled to the ninth node;
a sixth transistor that includes a drain that is coupled to the ninth node, a gate that is coupled to the ninth node, and a source that is coupled to the fourth node;
a seventh transistor circuit that includes a source that is coupled to the fourth node, a drain that is coupled to the tenth node, and a gate that is coupled to the ninth node; and
a capacitance circuit that is coupled between the second node and the ninth node.

15. The apparatus of claim 11, the bias circuit further comprising:
a fifth transistor circuit that includes a drain that is coupled to the second node, a gate that is coupled to a ninth node, and a source that is coupled to the ninth node;
sixth transistor that includes a drain that is coupled to the ninth node, a gate that is coupled to the ninth node, and a source that is coupled to the fourth node;
a seventh transistor circuit that includes a source that is coupled to the fourth node, a drain that is coupled to the tenth node, and a gate that is coupled to the ninth node;
a fourteenth transistor circuit that includes a source that is coupled to the fourth node, a gate that is coupled to the sixth node, and a drain that is coupled to the ninth node; and
a capacitance circuit that is coupled between the second node and the ninth node.

16. An apparatus that is arranged to provide a detection signal, the apparatus comprising:
a comparison means that is arranged to compare signals associated with a seventh node and a third node;
a resistance means that is coupled between a first node and the seventh node, wherein the resistance means is arranged to isolate the first node from the seventh node;
a first current source means that is arranged to sink a first current from the seventh node to a fourth node, wherein the first current has a first magnitude;
a second current source means that is arranged to sink a second current having a second magnitude; and
a means for coupling that is arranged to selectively couple the second current source between the seventh node and the fourth node in response to the detection signal such that hysteresis is provided by the second current source means in the apparatus.

* * * * *

UNITED STATES PATENT AND TRADEMARK OFFICE
CERTIFICATE OF CORRECTION

PATENT NO.     : 6,919,811 B1
DATED          : July 19, 2005
INVENTOR(S)    : Potanin et al.

It is certified that error appears in the above-identified patent and that said Letters Patent is hereby corrected as shown below:

Column 1,
Line 23, "Nick-Metal-Hydride" should read -- Nickel-Metal-Hydride --.
Line 43, "Resistors R3" should read -- Resistors R31 --.

Column 2,
Line 62, "node. N7," should read -- node N7, --.
Line 66, "drain' that is" should read -- drain that is --.
Line 66, "a-gate that" should read -- a gate that --.
Line 67, "is-coupled to" should read -- is coupled to --.

Column 3,
Line 5, "output th at is" should read -- output that is --.
Line 25, "circuit COMP and" should read -- circuit COMP, and --.
Line 39, "responsivee to the output" should read -- responsive to the output --.
Line 40, "circuit M2'" should read -- circuit M2 --.
Line 60, "Thus; the voltage" should read -- Thus, the voltage --.

Column 5,
Line 2, "circuit MIO" should read -- circuit M10 --.
Line 36, "node NIO" should read -- node N10 --.

Column 6,
Line 29, "form the seventh" should read -- from the seventh --.
Lines 41 and 54, "the eight node" should read -- the eighth node --.
Line 66, "breakdown of" should read -- breakdown of the --.

Column 7,
Line 18, "coupled to fourth node" should read -- coupled to the fourth node --.
Line 28 and 49, "an ninth transistor" should read -- a ninth transistor --.
Lines 31 and 61, "an twelfth transistor" should read -- a twelfth transistor --.
Line 56, "a eleventh transistor" should read -- an eleventh transistor --.

UNITED STATES PATENT AND TRADEMARK OFFICE
CERTIFICATE OF CORRECTION

PATENT NO. : 6,919,811 B1
DATED : July 19, 2005
INVENTOR(S) : Potanin et al.

It is certified that error appears in the above-identified patent and that said Letters Patent is hereby corrected as shown below:

<u>Column 8,</u>
Line 35, "sixth transistor" should read -- a sixth transistor --.

Signed and Sealed this

Eighth Day of November, 2005

JON W. DUDAS
*Director of the United States Patent and Trademark Office*